(12) United States Patent
Becker et al.

(10) Patent No.: US 6,558,559 B1
(45) Date of Patent: *May 6, 2003

(54) METHOD OF MANUFACTURING MICROMECHANICAL SURFACE STRUCTURES BY VAPOR-PHASE ETCHING

(75) Inventors: Volker Becker, Marxzell (DE); Franz Laermer, Stuttgart (DE); Michael Offenberg, Kirchentellinsfurt (DE); Andrea Schilp, Schwaebisch Gmuend (DE)

(73) Assignee: Robert Bosch GmbH, Stuttgart (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 11 days.

(21) Appl. No.: 09/019,011

(22) Filed: Feb. 5, 1998

(30) Foreign Application Priority Data

Feb. 6, 1997 (DE) .......................................... 197 04 454

(51) Int. Cl.$^7$ .............................. C23F 1/00; C23F 1/12; C23F 1/14; C23F 1/24
(52) U.S. Cl. .............................. 216/2; 216/11; 216/63; 216/73; 216/79; 216/58
(58) Field of Search ................................ 216/2, 11, 63, 216/73, 79, 58

(56) References Cited

U.S. PATENT DOCUMENTS 5,282,925 A * 2/1994 Jeng et al. .................. 156/646

FOREIGN PATENT DOCUMENTS

WO        WO 92/03740       3/1992

OTHER PUBLICATIONS

M. Bibel, *Physikalische Blätter* [*Physical Letters*], 1996, 52, pp. 1010–1012.*

M. Offenberg, B. Elsner and F. Lärmer, *Proc. 186$^{th}$ Electrochem. Soc. Meeting, Sensor Genero Session*, Miami Beach, Florida, Oct. 1994.*

* cited by examiner

*Primary Examiner*—Rabon Sergent
(74) *Attorney, Agent, or Firm*—Kenyon & Kenyon

(57) ABSTRACT

A method of sacrificial layer etching of micromechanical surface structures, in which a sacrificial layer is deposited on a heatable silicon substrate and is structured. A temperature difference between the substrate and the vapor phase of an etching medium is established in such a way that exposed metal contacts made of aluminum alloys are not attacked at the same time and are not subsequently exposed to any risk of corrosion.

22 Claims, 1 Drawing Sheet

METHOD OF MANUFACTURING MICROMECHANICAL SURFACE STRUCTURES BY VAPOR-PHASE ETCHING

FIELD OF THE INVENTION

The present invention relates to a method of manufacturing micromechanical surface structures by means of a vapor-phase etching medium, avoiding aluminum contact corrosion.

BACKGROUND INFORMATION

In silicon surface micromechanics, a layer structure is used, consisting of a sacrificial layer, usually $SiO_2$, on a substrate surface, usually a silicon substrate, with a layer of active silicon, usually polysilicon or single-crystal silicon (SOI), on top, in which structures, to be exposed later, are produced. Additional layers, e.g., buried polysilicon printed conductors, may also be present, but they do not play any role in the purely mechanical function of the components. In general, metal contact surfaces are provided on the active silicon layer for electric contacting of the components. Various aluminum alloys (AlSi, AlSiCu, etc.) containing aluminum as the predominant element have become established as contact materials in semiconductor technology, the repertoire of which has been used preferentially in surface micromechanics.

It is known that to produce unsupported micromechanical surface structures, they are first etched into the top layer of active silicon until the underlying sacrificial layer, usually $SiO_2$, is reached (M. Bibel, *Physikalische Blätter* [*Physical Leters*], 1996, 52, pp. 1010–1012). To expose the structures created in this way, the sacrificial layer is dissolved, for example, by an isotropic wet etching method (PCT International Publication No. WO 92-03740), where gaseous hydrogen fluoride over an azeotropic hydrofluoric acid-water mixture can be used (M. Offenberg, B. Elsner and F. Lärmer, *Proc. 186th Electrochem. Soc. Meeting, Sensor General Session*, Miami Beach, Fla., October 1994).

HF vapor is known to convert $SiO_2$ to volatile silicon fluorides, thereby dissolving it away under the structures:

The presence of water is necessary for this reaction to take place. It can be seen from this reaction equation that more water is formed than used. The important advantage of using gaseous hydrogen fluoride in comparison with aqueous hydrofluoric acid solutions is that with an optimum choice of measurement parameters there is no irreversible sticking of the exposed silicon structures to one another or to the substrate due to the surface tension of drying droplets of fluid in the subsequent drying of the substrate.

An important disadvantage of this vapor-phase etching process is that the gaseous hydrogen fluoride attacks not only $SiO_2$ but also the aluminum contacts that have been applied to the electronic components. In vapor-phase etching, the aluminum hydroxide fluorides produced cannot be removed but instead they remain as a rather thick insulating layer on the contact surface, which makes subsequent wire bonding of the aluminum contacts impossible. Washing off this layer would in turn result in sticking of the micromechanical surface structures already exposed and therefore is also impossible. Another problem with the resulting aluminum hydroxide fluoride layers is that they are hygroscopic, and water absorbed penetrates to the interlayer of metallic aluminum with the aluminum hydroxide fluoride layer, thus leading to progressive corrosion both during and after the etching of the sacrificial layer is completed.

The aluminum contacts may be protected during the etching of the sacrificial layer by means of additional layers such as lacquers that are impermeable to hydrofluoric acid, but this represents an additional step that is complicated and technically very difficult during the process of manufacturing the micromechanical surface structures because hydrofluoric acid diffuses very rapidly through protective polymer layers and thus can reach the metal surface. In addition, the contact protection would also have to be removed again after etching the sacrificial layer, i.e., if already exposed sensitive structures are present on the wafer surface, which leads to additional problems, in particular with regard to yield and reproducibility.

SUMMARY OF THE INVENTION

By establishing a temperature difference between the substrate and the vapor phase of the etching medium on the basis of the partial pressure composition of the vapor-phase etching medium, it is possible to control the chemical reactions during etching in an especially advantageous manner. A temperature difference between the substrate and the vapor phase permits selective etching of $SiO_2$ on the basis of the reaction below without attacking the exposed aluminum contacts on the substrate. The first reaction which can take place on the aluminum surface is then as follows:

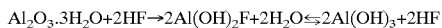

In the course of this reaction, the aluminum oxide hydrate breaks through at the surface. The hydroxide or hydroxide fluoride layer is hygroscopic. First, metallic aluminum is converted by the action of water under the influence of hydrofluoric acid to the oxide hydrate which can be fluorinated further by the following equation:

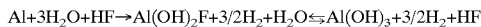

Aluminum hydroxide and aluminum hydroxide fluoride are in a reversible chemical equilibrium. The conversion of aluminum to the corrosion product takes place essentially with the uptake of water, in contrast with $SiO_2$ etching, where water is formed. Both reactions, i.e., etching aluminum and $SiO_2$, have in common the fact that they can take place only in the presence of water. Establishing a temperature difference between the substrate and the vapor phase of the etching medium permits, for example, rapid vaporization of the water formed on the substrate surface. Owing to the temperature difference, which is due to the partial pressure composition of the vapor-phase etching medium, water cannot condense on the substrate, and the parts of the surface which do not produce any water in the reaction with hydrofluoric acid, for example, remain dry and cannot be attacked.

In an advantageous embodiment of the method according to the present invention, the etching is performed at a temperature difference of 10–30 K, preferably 20 K, between the silicon substrate and the vapor-phase etching medium. The temperature of the vapor phase opposite the substrate is lower than the temperature of the substrate, so there is no condensation on the substrate surface. Consequently, the substrate surface is exposed to the vapor phase, but due to the higher substrate temperature, there cannot be any condensation on the substrate, and the parts of the substrate that cannot produce any water themselves in the reaction with hydrofluoric acid remain dry and cannot be attacked. This is true especially of the aluminum of the electric contacts which also does not release any water in the reaction with aqueous hydrofluoric acid, and therefore it does not react due to the absence of moisture. However, in the reaction with HF—$H_2O$, the sacrificial $SiO_2$ layer reacts by forming water, some of which is bound as hydroxide in the form of $Si(OH)_4$, as a precursor to additional reactions with HF to form volatile silicon tetrafluoride. The portion of the reaction water that is not bound as a hydroxide remains on the $SiO_2$ surface for a relatively short period of time and is rapidly evaporated because of the higher wafer temperature in comparison with the vapor phase.

In any case, even the transient presence of this reaction water accelerates the subsequent reaction of $SiO_2$ (or then $Si(OH)_4$) with HF, which supplies even more water for the reaction, until an equilibrium moisture content of the $SiO_2$ and $Si(OH)_4$ surfaces prevails. This acceleration of the $SiO_2$ etching process from initially very minor removal of material, which is initiated only by the water from the vapor phase, up to high etching rates results in achieving a high, quasi-steady-state silicon oxide etching rate after a start-up phase of approximately 5 to 7 minutes after the start of the process.

In another preferred embodiment, the temperature of the silicon substrate is at least 333 K, preferably 343–353 K, in particular 353 K ad at most 373 K. Consequently, there is no avalanche of dissolution reaction due to uptake of water from the gas phase on the dry aluminum surfaces that can form no reaction water and thus there is also no significant corrosion. At this temperature, additional protective mechanisms for the aluminum come advantageously into effect, resulting the fact that no fluorides remain on the surface. Thus, any delayed corrosion is effectively prevented even long after the actual etching of the sacrificial layer. The reliability of the components produced in this way is thus greatly improved.

Aluminum oxide hydrate, aluminum hydroxide or aluminum hydroxide fluoride present on the surface is dehydrated, i.e., water or the water of crystallization is removed in the form of hydroxides, or also HF; fluorine in the form of its fluorides is thus completely removed from the surface layer.

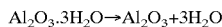

Structural compaction of the layer passivating the aluminum surface occurs in this dehydration, i.e., its pore density and permeability decrease, while its imperviousness and passivation with respect to water and HF increase. The chemical resistance of the layer passivating the aluminum surface, i.e., its protective effect, is thus increased in particular by the formation of compounds such as aluminates which are more chemically stable and inert. This effect is especially operative above a temperature range of 343–353 K. Up to a substrate temperature of 373 K, strong $SiO_2$ etching can still be performed, without any aluminum contact corrosion occurring. At temperatures in the preferred temperature range of 343–353 K, especially at 353 K, there is no longer any fluorination of the aluminum surface, i.e., the aluminum surfaces do not contain any fluorine atoms or ions after etching.

In another preferred embodiment, the vapor phase is adjusted so that another gas which is essentially chemically inert under the selected reaction conditions is used and is introduced into the etching apparatus. The establishment of a "quasi-azeotropic" mixture is thus regulated easily through the moisture in this gas. The chemically inert gas for dilution may also contain oxygen, so it is even possible to use air.

In another embodiment of the present invention, the partial pressure composition of the etching medium can be adjusted as a function of a temperature of the etching medium and/or as a function of a composition of components of the vapor phase.

DETAILED DESCRIPTION

Figure 1:
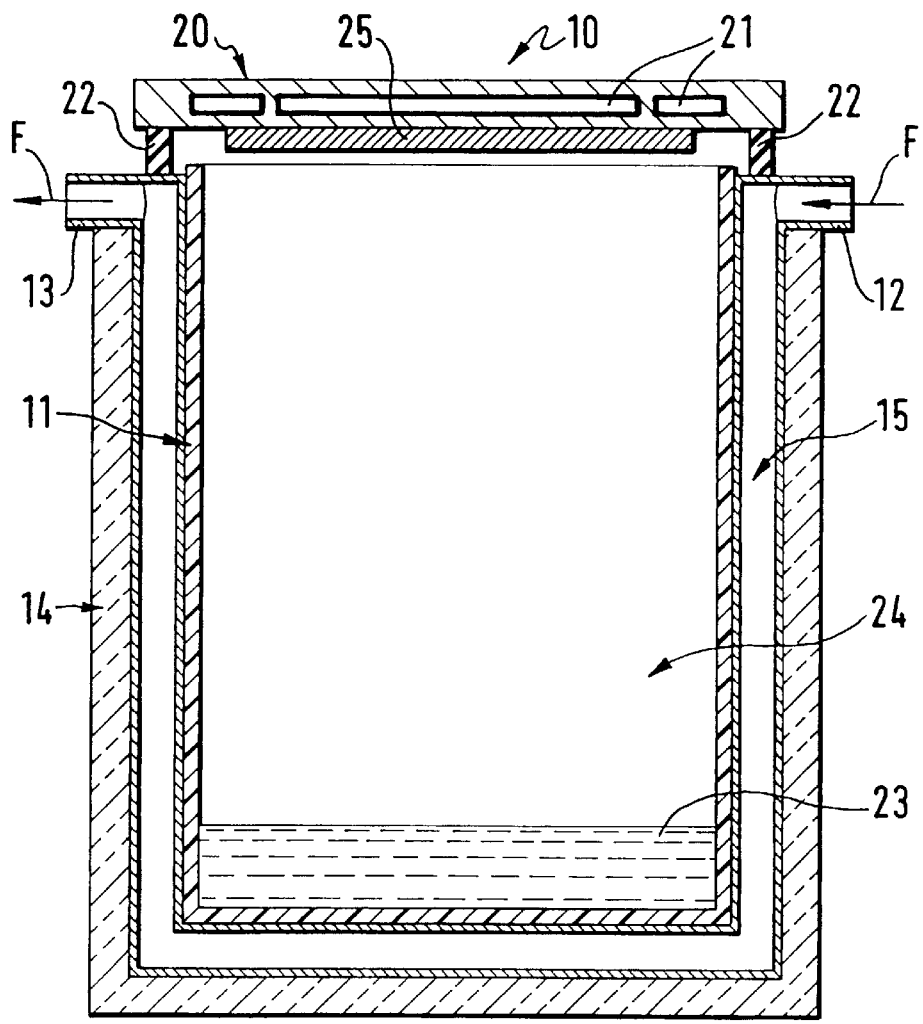
FIG. 1 shows an apparatus for carrying out the process according to the present invention.

FIG. 1 shows a container 11 made of Teflon, for example, and containing an azeotropic mixture 23 of water and hydrofluoric acid in which there is arranged a silicon substrate 25. It is completely surrounded by a heating jacket 15 through which water, held, for example, at the selected temperature by a thermostatic regulator (not shown), is circulated. This stabilizes the temperature of the Teflon container 11 and the azeotropic water-hydrofluoric acid mixture 23 at the desired level. Of course, any other type of heating, e.g., electric heating strips, hot air blowers, hot water jackets, etc. are also conceivable. It is important only that the walls of the Teflon container 11 and the water-hydrofluoric acid mixture 23 can be brought uniformly to the same temperature, so that condensation of moisture on the walls can be prevented and an especially homogeneous vapor phase can be produced.

Teflon container 11 has an inlet 12 and an outlet 13 through which water, for example, at a selectable temperature can be passed in the direction of arrow F. Teflon container 11 and heating jacket 15 are mounted in an insulating jacket 14 so that the temperature inside Teflon container 11 can be kept constant. Teflon container 11 is sealed by a cover 20 which has gaskets 22 made of Teflon, Viton or other gasket materials that are resistant to gaseous hydrogen fluoride. A heating device 21 is mounted in this cover 20 so that the silicon substrate 25 mounted on the inside of the cover 20 can also be heated. In this way, the silicon substrate 25 can be brought to the desired high temperature of 330–373 K, for example, preferably 353 K. Heating device 21 may again be hot water circulation, or electric heating films (not shown) may be used in combination with a thermocouple and an electronic temperature regulator.

The substrate temperature has a direct influence on the $SiO_2$ etching rate, so the most uniform possible temperature distribution over substrate surface 25 must be achieved. With the device according to the present invention, this is achieved with two heating films (not shown), an internal circular heating film and an external annular heating film that can be controlled electrically independently of one another. Through appropriate regulation of the heating power of the internal film element and the external film ring, a very uniform temperature distribution over substrate surface 25, e.g., a 6" silicon wafer, can be achieved with a uniformity of better than a 1 K temperature difference. The material of heating device 21 may be silicon, which has a good thermal conductivity and is stable with respect to gaseous hydrogen fluoride.

As an alternative, a Teflon plate may also be used, either carrying the heating elements or provided with a duct system through which hot water flows at a freely selectable temperature, regulated by a second thermostat.

Figure 2:
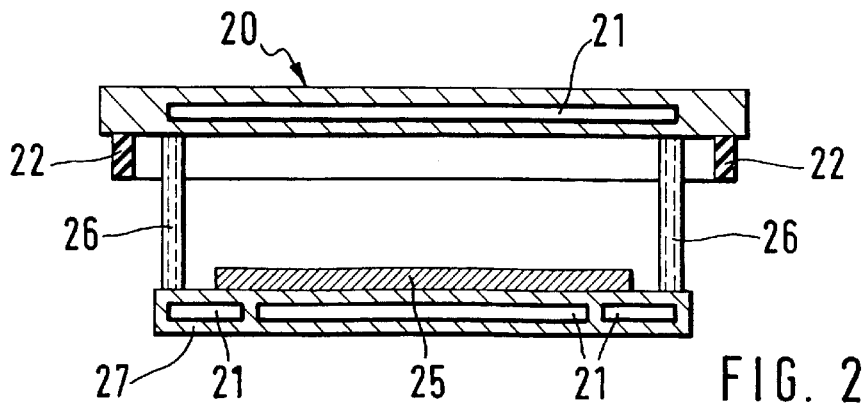
FIG. 2 shows another embodiment of the cover of the apparatus in FIG. 1.

FIG. 2 shows another possible embodiment of cover 20 of the device for carrying out the process according to the present invention.

Silicon substrate 25 is not clamped overhead against a top heating plate 20 but instead is placed on a heated bottom substrate plate 27, which is connected to the top plate. Substrate plate 27 contains one of the heating devices 21 described previously. Cover 20 is heated by heating elements 21 to prevent condensation of HF gas. The temperature of heating plate 27 carrying silicon substrate 25 is monitored and has a homogeneous distribution over the substrate surface. Heating plate 27 and cover plate 20 are connected by at least two hollow Teflon webs 26, for example. In the case of electric heating elements 21, the electric current leads and the electric connection are carried to the outside in the form of wires (not shown) through the hollow webs, so that no hydrofluoric acid comes in contact with the wires. With hot water heating 21, hot water flows through heating coil 21 from the cover plate and wafer heating plate through hollow webs 26.

An azeotropic mixture is advantageously selected as the water-hydrofluoric acid mixture 23, i.e., a mixture with an HF concentration of approximately 38%. With an azeotropic mixture, water and HF are vaporized in a constant ratio so that the concentration of the solution remains constant over a long period of time, i.e., the hydrofluoric acid concentration remains unchanged as the quantity of solution decreases. Thus, there are constant vapor etching conditions for many substrates to be treated over a long period of time, which leads to good reproducibility and very low maintenance.

Silicon substrate 25 to be treated is first inserted into cover 20 and is clamped by a Teflon holding ring (not shown). After a waiting time of 2 to 5 minutes, for example, to allow the wafer enough time to heat up to the preselected temperature of heating device 21, the device is uncovered, and heatable cover 20 carrying the substrate is placed on it instead. With a start-up phase of approximately five minutes, the sacrificial $SiO_2$ layer is then removed under the structures that are to be exposed. After a process time of typically 20 minutes, an undercutting width of 5 µm has been reached and the process is concluded. Then heatable cover 20 carrying substrate 25 is removed from the etching apparatus and the latter is covered again. Silicon substrate 25 remains in heated cover 20 for a few minutes so that HF residues and any moisture present are removed completely. This prevents any subsequent corrosion. After this waiting time, silicon substrate 25 is removed from the apparatus and sent to the processes which follow the etching of the sacrificial layer.

With cover 20 which is shown in FIG. 2, silicon substrate 25 is simply placed on heating plate 27 without any further clamping, with gravity ensuring the contact. This also greatly simplifies the loading and unloading of the apparatus.

With another apparatus (not shown), the establishment of a defined vapor phase, i.e., a vapor phase with constant conditions, which is in equilibrium at a lower temperature than the temperature of the substrate, is achieved due to the fact that nitrogen or oxygen or air, for example, is humidified over a water-cooled bubbler and fed into etching apparatus 10. Of course, any other gas such as argon, etc., that is essentially chemically inert under these conditions may also be used. In this case, the apparatus is not a closed system, but instead the gases flow through it continuously. The water supply in the nitrogen bubbler is heated to the temperature at which the vapor phase is to be in equilibrium. The nitrogen flow and the bubble size in the bubbler must be set so that an equilibrium can in fact develop in the gas phase. While the equilibrium temperature of the gas phase is set through the nitrogen flow and the bubbler temperature, the $SiO_2$ etching rate is controlled directly through the stream of dry hydrofluoric acid supplied independently. It is also possible to supply an additional stream of dry nitrogen through an additional apparatus (not shown) and to further reduce the moisture content of the gas phase.

In an additional apparatus (not shown), the mass transport to the substrate can be monitored and influenced. Under otherwise comparable boundary conditions, a higher flow of hydrofluoric acid leads to a higher $SiO_2$ etching rate, and a lower flow of hydrofluoric acid leads to a lower $SiO_2$ etching rate. It is important to ensure that the resulting reaction water can still be vaporized rapidly enough to prevent the formation of large droplets that could cause irreversible sticking of the resulting micromechanical surface structures to each other and to the substrate.

What is claimed is:

1. A method for manufacturing micromechanical surface structures, comprising:
    depositing a sacrificial layer on a heatable silicon substrate;
    depositing a further layer on the sacrificial layer;
    establishing a temperature difference between the substrate and a vapor-phase etching medium to prevent a condensation of water on the substrate, a substrate temperature of at least 330 K being established, the substrate temperature being established higher than a temperature of the vapor-phase etching medium; and
    removing the sacrificial layer using the vapor-phase etching medium in an etching process to form the micromechanical surface structures, water being present during the etching process.

2. The method according to claim 1, wherein the etching medium includes at least two components.

3. The method according to claim 1, wherein the vapor-phase etching medium contains a chemically inert gas.

4. The method according to claim 3, wherein the inert gas includes nitrogen.

5. The method according to claim 1, further comprising the step of:
    adjusting a partial pressure composition of the vapor-phase etching medium as a function of the temperature of the vapor-phase etching medium.

6. The method according to claim 1, further comprising the step of:
    adjusting a partial pressure composition of the vapor-phase etching medium as a function of a composition of components of the vapor-phase etching medium.

7. The method according to claim 1, further comprising the step of:
    adjusting a partial pressure composition of the vapor-phase etching medium as a function of a temperature of the vapor-phase etching medium and a composition of components of the vapor-phase etching medium.

8. The method according to claim 1, wherein the temperature difference is between 10 K and 30 K.

9. The method according to claim 8, wherein the temperature difference is about 20 K.

10. The method according to claim 8, wherein the substrate temperature is at least 333 K.

11. The method according to claim 10, wherein the substrate temperature is between 333 K and 373 K.

12. The method according to claim 10, wherein the substrate temperature is about 353 K.

13. The method according to claim 1, further comprising:
providing metal contact surfaces for electric contacting of components on the further layer.

14. The method according to claim 13, wherein the providing metal contact surfaces step includes providing one of: i) aluminum contact surfaces, or ii) aluminum alloy contact surfaces.

15. The method according to claim 13, wherein the removing step includes exposing the metal contact surfaces to the vapor-phase etching medium.

16. The method according to claim 15, wherein the vapor-phase etching medium does not attack the metal contact surfaces during the etching process.

17. A method for manufacturing micromechanical surface structures, comprising:
depositing a sacrificial layer on a heatable silicon substrate;
depositing a further layer on the sacrificial layer;
establishing a temperature difference between the substrate and a vapor-phase etching medium to prevent a condensation of water on the substrate, a substrate temperature of at least 330 K being established, the substrate temperature being established higher than a temperature of the vapor-phase etching medium;
removing the sacrificial layer using the vapor-phase etching medium in an etching process; and
producing the vapor-phase etching medium by vaporizing an azeotropic water-hydrofluoric acid mixture.

18. A method for manufacturing micromechanical surface structures, comprising:
depositing a sacrificial layer on a heatable silicon substrate;
depositing a further layer on the sacrificial layer;
providing metal contact surfaces for electric contacting of components on the further layer;
establishing a temperature difference between the substrate and a vapor-phase etching medium to prevent a condensation of water on the substrate, a substrate temperature of at least 330 K being established, the substrate temperature being established higher than a temperature of the vapor-phase etching medium;
exposing the metal contact surfaces to the vapor-phase etching medium; and
removing the sacrificial layer using the vapor-phase etching medium in an etching process to form the micromechanical surface structures, water being present during the etching process.

19. The method according to claim 18, wherein the vapor-phase etching medium does not attack the metal contact surfaces during the etching process.

20. A method for manufacturing micromechanical surface structures, comprising:
depositing a sacrificial layer on a heatable silicon substrate;
depositing a further layer on the sacrificial layer;
establishing a temperature difference between the substrate and a vapor-phase etching medium to prevent a condensation of water on the substrate, a substrate temperature of at least 333 K being established, the substrate temperature being established higher than a temperature of the vapor-phase etching medium; and
removing the sacrificial layer using the vapor-phase etching medium in an etching process to form the micromechanical surface structures, water being present during the etching process.

21. A method for manufacturing micromechanical surface structures, comprising:
depositing a sacrificial layer on a heatable silicon substrate;
depositing a further layer on the sacrificial layer;
establishing a temperature difference between the substrate and a vapor-phase etching medium, a substrate temperature of at least 330 K being established, the substrate temperature being established higher than a temperature of the vapor-phase etching medium; and
removing the sacrificial layer using the vapor-phase etching medium in an etching process to form the micromechanical surface structures, water being present during the etching process.

22. A method for manufacturing micromechanical surface structures, comprising:
depositing a sacrificial layer on a heatable silicon substrate;
depositing a further layer on the sacrificial layer;
providing metal contact surfaces for electric contacting of components on the further layer;
establishing a temperature difference between the substrate and a vapor-phase etching medium, a substrate temperature of at least 330 K being established, the substrate temperature being established higher than a temperature of the vapor-phase etching medium;
exposing the metal contact surfaces to the vapor-phase etching medium; and
removing the sacrificial layer using the vapor-phase etching medium in an etching process to form the micromechanical surface structures, water being present during the etching process.

* * * * *